United States Patent
Li et al.

(10) Patent No.: US 11,587,597 B2
(45) Date of Patent: Feb. 21, 2023

(54) CONNECTOR RETENTION MECHANISM FOR IMPROVED STRUCTURAL RELIABILITY

(71) Applicant: Intel Corporation, Santa Clara, CA (US)

(72) Inventors: Xiang Li, Portland, OR (US); Phil Geng, Portland, OR (US); George Vergis, Portland, OR (US); Mani Prakash, University Place, WA (US)

(73) Assignee: Intel Corporation, Santa Clara, CA (US)

( * ) Notice: Subject to any disclaimer, the term of this patent is extended or adjusted under 35 U.S.C. 154(b) by 244 days.

(21) Appl. No.: 16/911,168

(22) Filed: Jun. 24, 2020

(65) Prior Publication Data
US 2020/0327912 A1 Oct. 15, 2020

(51) Int. Cl.
*G11C 5/04* (2006.01)
*H05K 1/18* (2006.01)
*H05K 3/34* (2006.01)
*H05K 3/40* (2006.01)
*G06F 1/18* (2006.01)

(52) U.S. Cl.
CPC .............. *G11C 5/04* (2013.01); *G06F 1/184* (2013.01); *H05K 1/181* (2013.01); *H05K 1/184* (2013.01); *H05K 3/3436* (2013.01); *H05K 3/4092* (2013.01); *H05K 2201/10159* (2013.01)

(58) Field of Classification Search
CPC ............ G11C 5/05; G06F 1/184; H05K 1/181
See application file for complete search history.

(56) References Cited

U.S. PATENT DOCUMENTS

| | | | | |
|---|---|---|---|---|
| 4,293,175 A | * | 10/1981 | Cutchaw | H05K 7/1061 257/E23.098 |
| 4,345,810 A | * | 8/1982 | Bakermans | H05K 7/1069 439/71 |
| 4,560,217 A | * | 12/1985 | Siano | H05K 7/1069 439/108 |
| 4,597,617 A | * | 7/1986 | Enochs | H05K 3/325 361/749 |
| 5,201,671 A | * | 4/1993 | Elias | H01R 12/00 439/492 |
| 5,648,893 A | * | 7/1997 | Loo | H01L 23/4006 257/E23.084 |
| 5,883,782 A | * | 3/1999 | Thurston | H01L 23/4006 361/720 |
| 6,042,388 A | * | 3/2000 | Tustaniwskyj | H01R 12/57 439/74 |
| 6,299,460 B1 | * | 10/2001 | Haselby | H01R 12/82 439/67 |
| 6,325,638 B1 | * | 12/2001 | Chapin | H05K 3/325 200/248 |

(Continued)

*Primary Examiner* — Neil Abrams
(74) *Attorney, Agent, or Firm* — Compass IP Law PC

(57) ABSTRACT

A connector includes mounting tabs that are extended relative to traditional mounting tabs. On a back side of the printed circuit board (PCB), the mounting tabs connect to a back plate. The mounting tabs extend through the PCB and connect with the back plate, which provides improved structural integrity. Depending on the connector, the use of the mounting tabs can use existing mounting holes for the connector and remove the need for additional mounting holes.

17 Claims, 10 Drawing Sheets

(56) References Cited

U.S. PATENT DOCUMENTS

| | | | | |
|---|---|---|---|---|
| 6,386,890 | B1* | 5/2002 | Bhatt | H05K 3/325 |
| | | | | 439/67 |
| 6,392,889 | B1* | 5/2002 | Lee | H01L 23/4093 |
| | | | | 24/453 |
| 6,538,893 | B1* | 3/2003 | Hsu | H01L 23/4093 |
| | | | | 24/457 |
| 6,634,890 | B2* | 10/2003 | Peterson | H01R 12/82 |
| | | | | 439/67 |
| 7,068,513 | B1* | 6/2006 | Xia | H01L 23/4093 |
| | | | | 257/E23.086 |
| 7,341,460 | B1* | 3/2008 | McHugh | H01R 12/7047 |
| | | | | 439/71 |
| 7,708,579 | B2* | 5/2010 | Yeh | H05K 7/1053 |
| | | | | 439/73 |
| 7,785,126 | B2* | 8/2010 | Peng | H01L 23/4093 |
| | | | | 439/71 |
| 8,070,495 | B2* | 12/2011 | Fan | H01R 13/73 |
| | | | | 439/61 |
| 8,279,606 | B2* | 10/2012 | Kyle | H01R 12/7076 |
| | | | | 257/713 |
| 2020/0327912 | A1* | 10/2020 | Li | G06F 1/184 |

* cited by examiner

CONNECTOR RETENTION MECHANISM FOR IMPROVED STRUCTURAL RELIABILITY

FIELD

Descriptions are generally related to connectors of a printed circuit board (PCB), and more particular descriptions are related to mounting mechanisms for structural retention.

BACKGROUND

Increasing component count and size in computing systems can put additional physical stress or strain on the printed circuit boards (PCBs). Such an effect is especially noticeable in memory systems, where more memory devices are included to meet increasing demand for memory resources. Additionally, with increasing memory bus frequencies and memory density, the memory systems have increasing heatsink mass. Emerging memory DIMMs (dual inline memory modules) are also being mounted with surface-mount connectors which has relatively lower structural integrity as compared to traditional through-hole connectors.

With the added mass on the computer motherboards, the board tend to bend, causing the connectors to fail. Thus, the upgraded components are putting increased structural stress on the PCBs, which can result in system failures. Such failures have been observed in memory DIMM connectors in the form of broken DIMM latches, cracks in the connector, and j-leads (the metal leads/contacts in the connector that make contact to contacts of the memory DIMM) pulling out of the connector.

BRIEF DESCRIPTION OF THE DRAWINGS

The following description includes discussion of figures having illustrations given by way of example of an implementation. The drawings should be understood by way of example, and not by way of limitation. As used herein, references to one or more examples are to be understood as describing a particular feature, structure, or characteristic included in at least one implementation of the invention. Phrases such as "in one example" or "in an alternative example" appearing herein provide examples of implementations of the invention, and do not necessarily all refer to the same implementation. However, they are also not necessarily mutually exclusive.

Descriptions of certain details and implementations follow, including non-limiting descriptions of the figures, which may depict some or all examples, and well as other potential implementations.

DETAILED DESCRIPTION

As described herein, a connector includes mounting tabs that are extended relative to traditional mounting tabs, to extend through the printed circuit board (PCB). The extended mounting tabs connect on the back side of the PCB to a back plate. The connection of the connector mounting tabs through the PCB with the back plate provides improved structural integrity. Depending on the connector, the use of the mounting tabs can use existing mounting holes for the connector and remove the need for additional mounting holes. The improved structural integrity can reduce or eliminate the structural failures mentioned previously.

The use of the backplate provides a retention mechanism for the connector, such as a DIMM (dual inline memory module) connector. Current DIMM connectors include mounting tabs to fit into corresponding mounting holes in the PCB, which can align and secure the connectors as well as additional mounting holes to secure the connectors to the board. Despite the mounting tabs, the increased mass continues to cause the issues identified previously. The connectors as described herein can utilize the same mounting holes, but with extended tabs to connect to backplates provides increased structural support for the connectors.

The use of the backplates can reduce the need for additional mounting holes. The removal of the additional mounting holes can improve routing continuity around the connector, which can improve signal integrity. Not only does the backplate improve the structural integrity for the connector itself, the use of the backplate with the connector can improve the structural reliability of other components in the vicinity of the connector that has the backplate. The vicinity of the connector includes not only the portion of the PCB that is directly above the backplate, but areas close to the backplate. The backplate provides increased stiffness and therefore structural integrity based on its structure. That stiffness will extend into areas surrounding the connector depending on the size and structure of the backplate used.

Figure 1A:
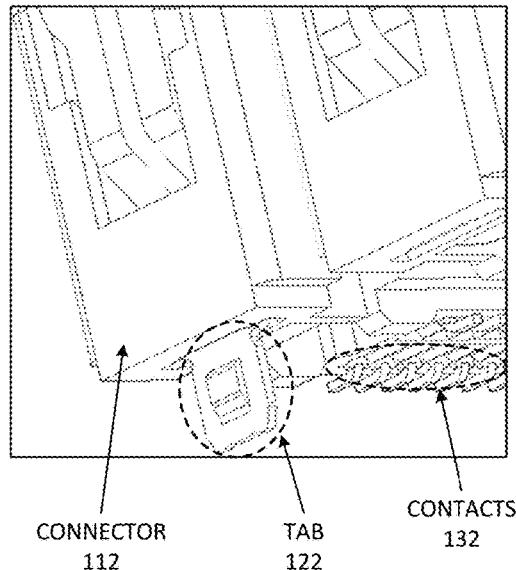
FIG. 1A is a diagrammatic representation of an example of a connector with an extended tab.
Figure 1A:
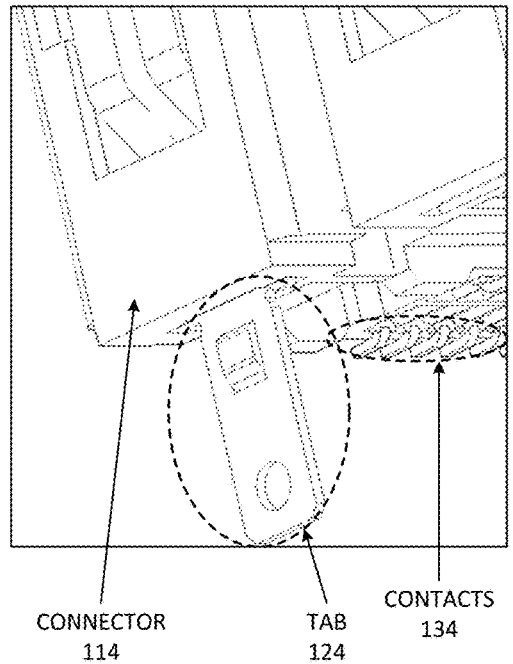

FIG. 1A is a diagrammatic representation of an example of a connector with an extended tab. Diagram 102 illustrates connector 112 with mounting tab 122. Tab 122 extends from the bottom of connector 112. Tab 122 will connect into a mounting hole on the PCB to which the connector is connected. Diagram 102 illustrates contacts 132, which represent electrical contacts for connector 112.

Contacts 132 represent electrical contacts, which provide a mechanism for something connected to connector 112 to make electrical contact with a PCB or another component connected to the PCB. Contacts 132 provide the electrical pathway that allows the signaling of a component connected to the PCB through connector 112 to communicate with a component connected to the PCB either directly or through a different connector.

It will be understood that tab 122 is a mounting tab that is separate from contacts 132. Tab 122 does not provide electrical signaling to connector 112. Tab 122 provides structural connection to mount connector 112 to a PCB via a mounting hole. Traditionally, tab 122 would extend through a PCB and be mounted to a mounting hole with a solder reflow process.

Diagram 104 illustrates connector 114 with mounting tab 124, which can be an extended version of tab 122. Tab 124 extends from the bottom of connector 114. Tab 124 will connect into a structural mounting hole on the PCB to which the connector is connected. Diagram 104 illustrates contacts 134, which represent electrical contacts for connector 114.

As with contacts 132, contacts 134 represent electrical contacts, whereas tab 124 represents a structural mechanism to mount the connector to a PCB. Thus, it will be understood that tab 124 is a mounting tab that is separate from contacts 134. Tab 124 provides structural connection to mount connector 114 to a PCB via a mounting hole, rather than a signaling contact. It will be observed that tab 124 extends much farther than tab 122 of diagram 102. Tab 124 will extend through a PCB and be mounted to the PCB and to a backplate (not specifically illustrated). In one example, tab 124 can be mounted to a backplate and a mounting hole with a solder reflow process. In one example, tab 124 can be mounted to a backplate and a mounting hole with wave solder process. The longer tab 124 is exposed out of the backside of the PCB for structural retention.

Figure 1B:
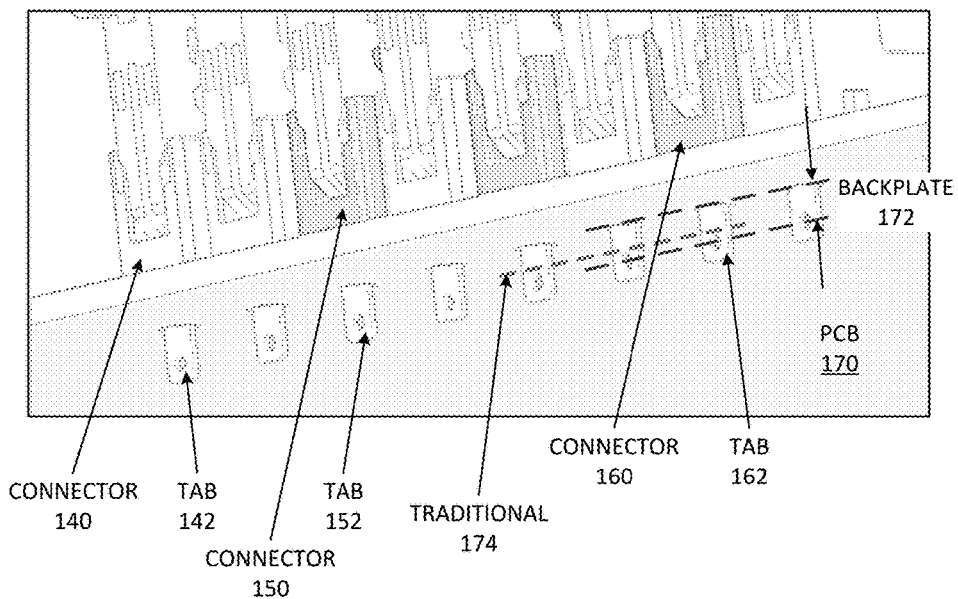
FIG. 1B is a diagrammatic representation of an example of connectors with extended tabs inserted through a PCB (printed circuit board).

FIG. 1B is a diagrammatic representation of an example of connectors with extended tabs inserted through a PCB (printed circuit board). Diagram 106 represents a PCB 170 to connect to multiple connectors with extended tabs, in accordance with an example of diagram 104. The backplate is not illustrated in diagram 106. Rather, diagram 106 illustrates how tabs such as tabs 124 can extend much further than traditional tabs such as tabs 122 of diagram 102. The lighter dashed line labeled as traditional 174 represents the extension of a traditional tab through PCB 170.

Diagram 106 also illustrates darker dashed lines to represent backplate 172, which would interface with the extended tabs. Diagram 106 illustrates multiple tabs extending through PCB 170 associated with multiple different connectors. Those tabs include tab 142 associated with connector 140, tab 152 associated with connector 150, and tab 162 associated with connector 160. It will be observed that there are other connectors and associated tabs; the three identified tabs were randomly selected from among the visible tabs.

It will be observed that tabs 142, 152, and 162 will extend further than backplate 172, which enables the connecting of the mounting tabs to the backplate for improved structural integrity. The structures identified as "tabs" could alternatively be referred to as pin stakes or some other identifier.

Figure 2A:
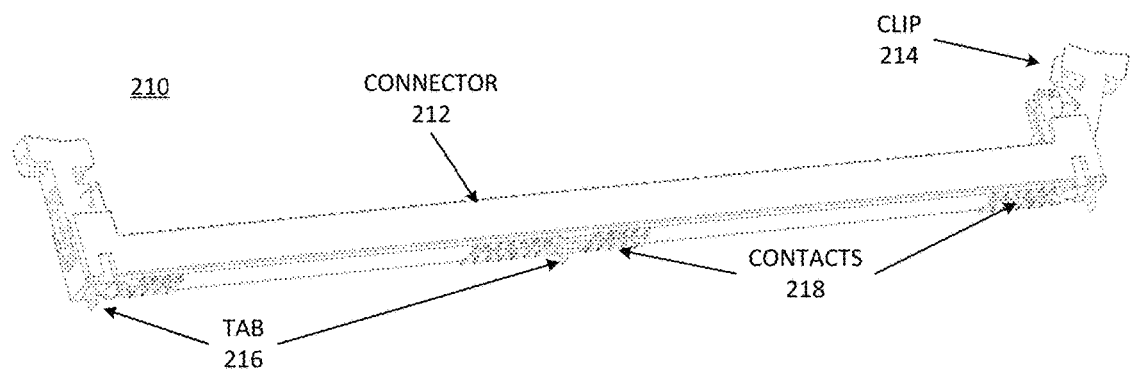
FIG. 2A is a diagrammatic representation of an example of a memory module connector with extended tabs.

FIG. 2A is a diagrammatic representation of an example of a memory module connector with extended tabs. Diagram 210 represents a connector with extended tabs. Connector 212 more particularly can represent a surface mount DIMM connector.

Connector 212 includes tabs 216, which represent the extended tabs to connect to a backplate through a PCB. Connector 212 includes contacts 218, which represent electrical contacts to provide the electrical signaling from memory devices of the DIMM to a PCB. In one example, contacts 218 are surface mount contacts. In one example, contacts 218 are through hole contacts or through hole pads, and connector 212 is a through hole mounted connector. If connector 212 includes through hole contacts, the backplate used to connect to tabs 216 would include electrical isolation or insulation. Thus, in one example, the backplate includes an electrical insulator.

Tabs 216 can be located in the same place as traditional metal tabs or stake pins for the DIMM connector. Thus, the use of tabs 216 would not require changing the layout of the PCB or the structure of connector 212. Instead, connector 212 could simply be made with longer tabs for mounting connector 212 to a PCB. Connector 212 can also include clip 214 to secure a DIMM into the connector. Because the mounting tabs extend out the bottom of connector 212, clips 214 could also be unaffected by the use of the tabs.

Figure 2B:
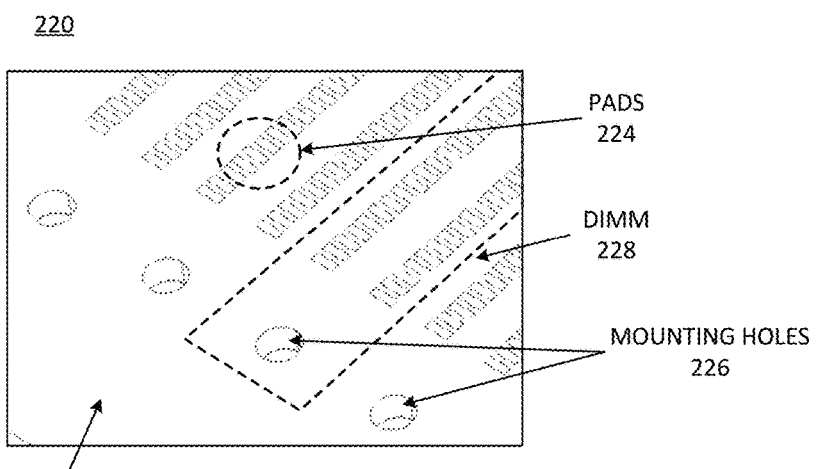
FIG. 2B is a diagrammatic representation of an example of a PCB with mounting holes for a connector with surface mount electrical connections and extended mounting tabs.

FIG. 2B is a diagrammatic representation of an example of a PCB with mounting holes for a connector with surface mount electrical connections and extended mounting tabs. Diagram 220 represents a top surface of a PCB to which connector 212 can be mounted. PCB 222 includes pads 224, which represent surface mount pads. For a through hole version of connector 212, pads 224 would be replaced with through hole contacts.

PCB 222 includes mounting holes 226. Mounting holes 226 represent holes to mount connectors such as a connector 212. Each mounting hole 226 would be for mounting a separate connector 212. The dashed line around the parallel rows of pads 224 and the mounting hole 226 represents an outline of an area to mount connector 212, with its contact pads and mounting hole. The dashed line is labeled DIMM 228 to illustrate an area to mount a DIMM connector.

Figure 2C:
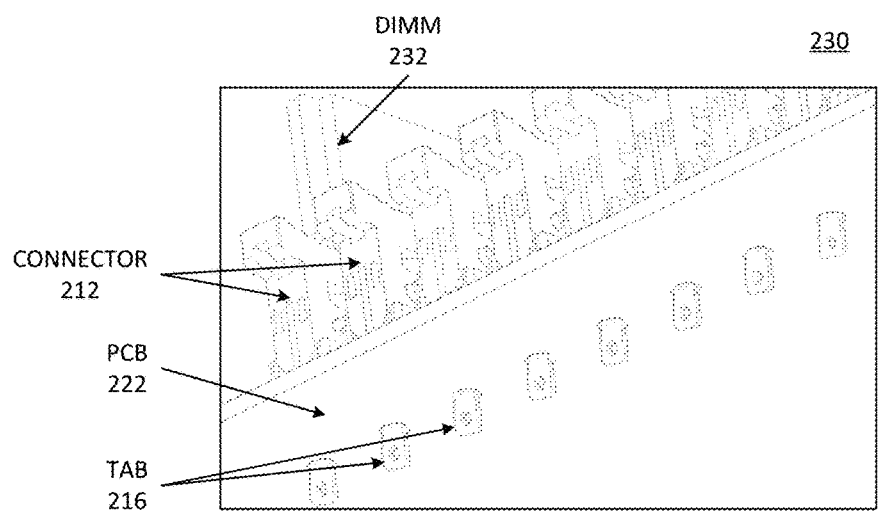
FIG. 2C is a diagrammatic representation of an example of a PCB with mounting holes for surface mount memory module connectors with extended mounting tabs.

FIG. 2C is a diagrammatic representation of an example of a PCB with mounting holes for surface mount memory module connectors with extended mounting tabs. Diagram 230 illustrates an example of multiple connectors 212 of diagram 210 mounted in PCB 222 of diagram 220. Tabs 216 of connectors 212 extend through mounting holes 226 to the back side of the PCB, which is the opposite side of the PCB as shown in diagram 220.

Diagram 230 also illustrates DIMM 232. DIMM 232 represents a DIMM that is mounted in one of connectors 212. Tabs 216 secure connectors 212 to PCB 222, to enable DIMM 232 to couple to components mounted to PCB 222.

Figure 3A:
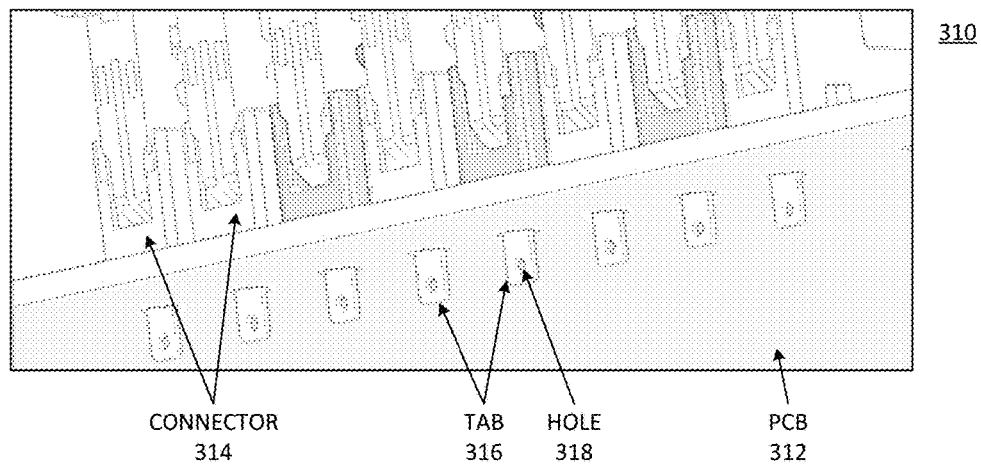
FIGS. 3A-3C are diagrammatic representations of an example of a PCB with a backplate to secure to extended mounting tabs of the connectors.

FIG. 3A is a diagrammatic representation of an example of a PCB with connectors having extended mounting tabs. Diagram 310 provides an example of PCB 312 with connectors 314 mounted on a top surface of the PCB. Connectors 314 include tabs 316, which are mounting tabs that extend through PCB 312 to the back side of the PCB. In one example, connectors 314 are surface mounted on PCB 312 with a reflow process.

Tabs 316 represent extended tabs in accordance with any example herein. In one example, tabs 316 include holes 318. Holes 318 provide a hole through the extended portion of the tab. Tabs 316 have a generally rectangular shape and are traditionally relatively flat. For example, the tabs can be pressed or stamped out of sheet metal. Thus, the tabs have a generally rectangular surface with sides that are much thinner than the two wide surfaces. Hole 318 goes through the tab from one surface to the other.

Figure 3B:
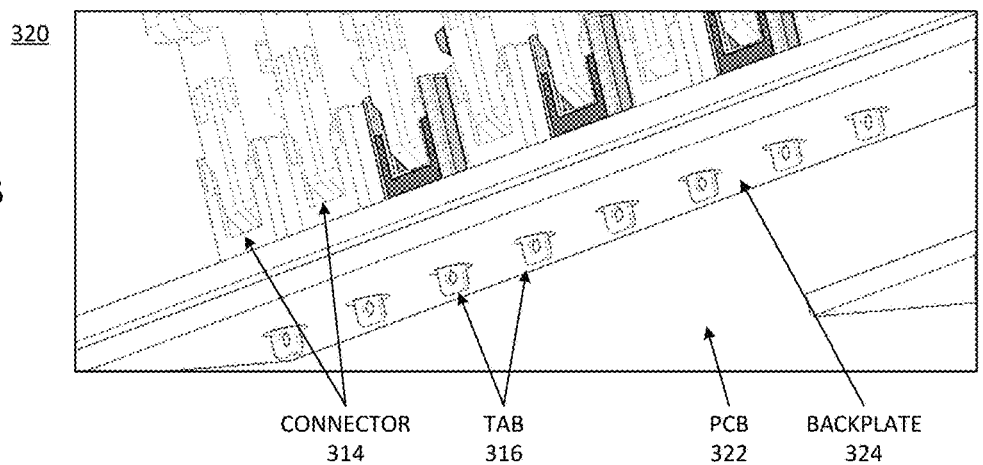

FIG. 3B is a diagrammatic representation of an example of a PCB with a backplate to secure to the extended mounting tabs of the connectors. Diagram 320 represents an example of the connectors and tabs of diagram 310. PCB 322 represents an example of PCB 312. PCB 322 may be identical to PCB 312.

Diagram 320 illustrates backplate 324. Backplate 324 is mounted to the back side of PCB 322, and secures to tabs 316 of connectors 314. In one example, backplate 324 has a thickness comparable to or greater than PCB 322. In one example, backplate 324 has a thickness that is less than PCB 322. Backplate 324 provides a stiffening to the system of PCB 322. Thus, with backplate 324 mounted on back, there will be less flexure of PCB 322 around the area of connectors 314.

Backplate 324 can be affixed to tabs 316 in any of a number of ways. In one example, backplate 324 includes mounting holes lined with metal to secure to tabs 316 via solder. In such an example, backplate 324 could be applied with a wave solder process or a reflow solder process. In one example, backplate 324 is metal or metallic. Backplate 324 can include an insulating layer to make contact with PCB 322 when connected to tabs 316. In one example, backplate 324 is a PCB material or epoxy material or resin material. In such example, backplate 324 can include mounting holes line with metal to connect to tabs 316.

In one example, backplate 324 attaches to tabs 316 via soldering. In one example, backplate 324 attaches to tabs 316 via clips. In one example, backplate 324 attaches to tabs 316 via riveting. In one example, backplate 324 attaches to tabs 316 via screw fasteners. Any such fastening mechanism such as screws or rivets can insert a mechanism through holes 318 in tabs 316.

Figure 3C:
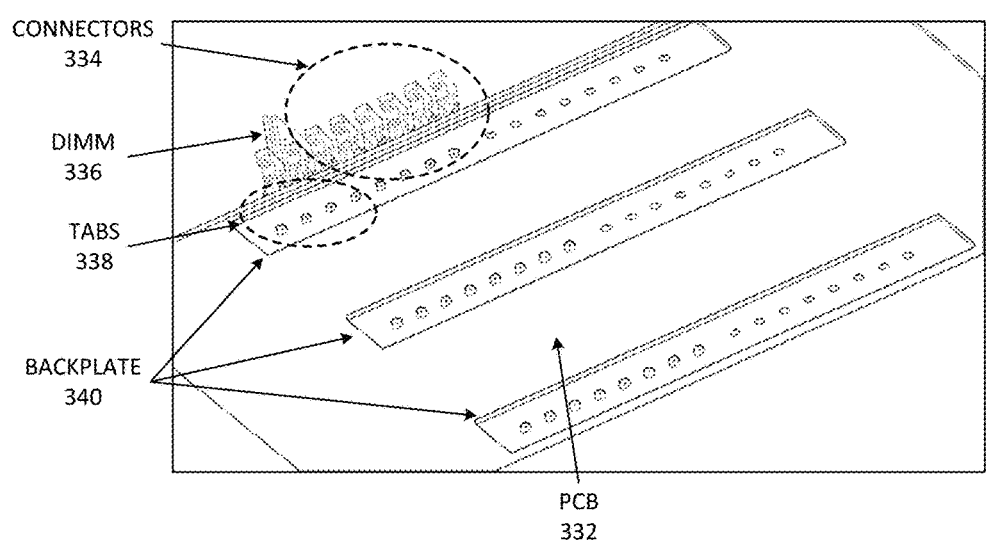

FIG. 3C is a diagrammatic representation of an example of a PCB with backplate segments to secure to groups of extended mounting tabs of the connectors. Diagram 330 represents an example of a PCB with connectors with extended tabs in accordance with diagram 320, where the backplate is segmented. It will be understood that the edges of PCB 332 are only an illustration, and do not necessarily represent a complete PCB for an implementation in a computing system. For example, a motherboard PCB could be larger than the outline of PCB 332.

PCB 332 provides an example of PCB 312 or PCB 322. Connectors 334 provide examples of connectors in accordance with connectors 314. In one example, connectors 334 represent DIMM connectors and DIMM 336 is illustrated in one of the connectors. Tabs 338 represent extended tabs for connector 334, which connect with backplate segments 340.

Backplate segments 340 can collectively represent a backplate for the system of diagram 330. In one example, connectors 334 each include a tab 316 on each end of the connector, and a tab 316 at or near the middle of the connector. Thus, backplate segments 340 can have three segments, one for each of the tab locations: one for each end of connectors 334 and one for the middle of connectors 334.

The backplate structure or structures provides structural robustness to the system of diagram 330. Such a backplate structure can be used for DIMM reinforcement by reinforcing the PCB stiffness. Backplate segments 340 reduce the risk of warpage of the PCB 332, even under stress conditions, which reduces the likelihood of damage to connectors 334 or their connections to PCB 332.

Figure 4:
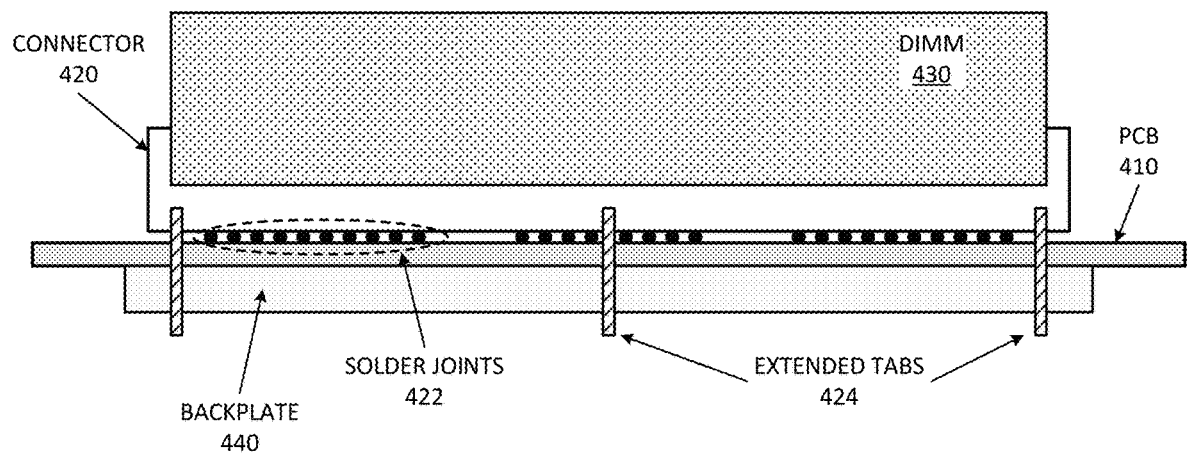
FIG. 4 is a diagrammatic representation of an example of a dual inline memory module (DIMM) connected to a connector that couples to a PCB with a backplate connected to extended mounting tabs.

FIG. 4 is a diagrammatic representation of an example of a dual inline memory module (DIMM) connected to a connector that couples to a PCB with a backplate connected to extended mounting tabs. System 400 illustrates an example of a system including a connector coupled to a backplate in accordance with an example of diagram 330.

System 400 includes PCB 410 to which to mount connector 420. In one example, connector 420 is a DIMM connector, and DIMM 430 is illustrated as being mounted in the connector. Connector 420 includes extended tabs 424 to mount through mounting holes in PCB 410 (not specifically labeled in system 400).

Solder joint 422 represent electrical connections between pads on PCB 410 and pins of connector 420. The pads connect to electrical traces or signal lines on PCB 410 to route to other components of PCB 410 (not specifically illustrated). Solder joints 422 provide electrical connection of DIMM 430 to PCB 410.

Extended tabs 424 mount through mounting holes in PCB 410, and can even be soldered to secure connector 420 and provide structural stability in the connection between connector 420 and PCB 410. Typically, extended tabs 424 do not provide an electrical connection between DIMM 430 and PCB 410, providing only structural support.

System 400 includes backplate 440 coupled to extended tabs 424 on a side of PCB 410 or a surface of PCB 410 that is opposite a surface on which connector 420 is mounted. For purposes of providing a normalized orientation, typically, connector 420 would be considered to be mounted on the top surface of PCB 410 and the surface to which backplate 440 is connected would be considered the back surface or under side of PCB 410. Backplate 440 is illustrated as a continuous piece of material making contact with all extended tabs 424 of connector 420. In one example, backplate 440 is segmented, making contact with one or more of extended tabs 424 and leaving a gap or a space between one segment and another segment connecting to one or more other backplate segments.

In one example, solder joints 422 can represent connections to through hole pins of connector 420. In such an example, system 400 would include an insulator between backplate 440 and PCB 410. Such an insulator can be part of or a surface of backplate 440, or can be an additional part placed between backplate 440 and PCB 410.

The application of backplate 440 to system 400 can reduce DIMM connector J-lead pullout or solder joint damage. The increased stiffness due to backplate 440 can reduce the likelihood of DIMM 430 popping out of connector 420 or damaging connector latches or cracks in the housing of connector 420. In one example, PCB 410 represents a computer system motherboard.

Figure 5A:
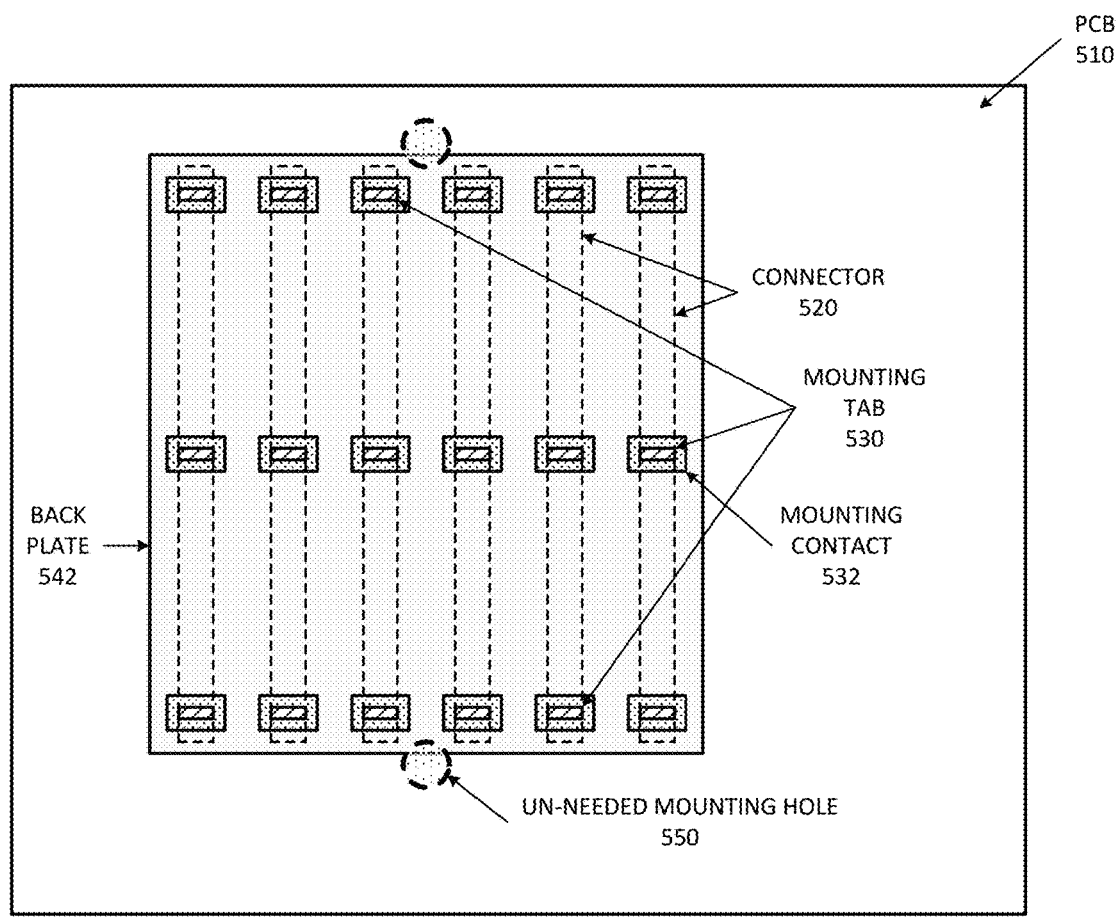
FIGS. 5A-5C are diagrammatic representations of examples of backplates to couple to mounting tabs through the PCB.

FIG. 5A is a diagrammatic representation of an example of a backplate to couple to mounting tabs through the PCB. Diagram 502 represents an example of a backplate for a connector in accordance with any example herein, such as diagram 106, diagram 230, diagram 330, or system 400.

PCB 510 represents a main PCB or motherboard for a system. Diagram 502 shows the surface of PCB 510 that is opposite the surface on which connectors will be mounted, and the surface to which backplate 542 will be mounted. Connectors 520 are illustrated as dashed lines to show an example of where they might be located on the other side of PCB 510.

Connectors 520 include mounting tabs 530 to extend through PCB 510 and connect to backplate 542. Backplate 542 is one large backplate that covers the entire area under connectors 520. Backplate 542 can be said to extend under all footings of connectors 520. Backplate 542 can reinforce in both horizontal directions (x and y directions) for connectors 520. Backplate 542 is illustrated as a rectangle. Backplate 542 can be square, or rectangular, or any other shape including non-symmetric shapes, to accommodate system requirements.

Mounting tabs 530 are illustrated as having a rectangular cross section, as was described previously. In one example, each mounting tab 530 has an associated or a corresponding mounting contact 532. Mounting contact 532 can represent an area of backplate 542 that will interact with solder, to form a solder joint between the mounting contact and the mounting tab. In such an example, backplate 542 can be connected to mounting tabs 530 via wave solder, reflow solder, or some other mechanism. Mounting contact 532 can alternatively represent an area of reinforcement or demarcation for connection with a non-solder connection mechanism (such as a screw or pin).

Traditional mechanisms for mounting connectors such as connectors 520 include the use of additional mounting holes. Un-needed mounting hole 550 represents a mounting hole in addition to the mounting holes to receive mounting tabs 530. The mounting holes are un-needed because backplate 542 provides sufficient structural support without the need for the additional mounting holes. Un-needed mounting hole 550 could allow an extension to a physical structure of connectors 520 to try to increase structural integrity. Backplate 542 can provide improved structural integrity beyond what is provided by un-needed mounting hole 550.

The removal of un-needed mounting hole 550 has implications not just for the structural integrity of PCB 510. Rather, the introduction of the mounting hole near the end of DIMM connectors has a negative impact on signal routing, as it is a large structure relative to the size of routing traces (not shown). Having to route all traces around the mounting hole has a negative impact on signal routing, which can be regained by elimination of the mounting hole. The increase in board space for routing is expected to result in improved signal integrity. In one example, the mounting holes for mounting tabs 530 are existing mounting holes in PCB 510. Such existing mounting holes can be or include chassis standoff holes, connector mounting holes, or other holes that are structural mounting holes separate from the electrical connections for the connector.

In one example, backplate 542 is a metallic plate. In one example, backplate 542 is a non-metallic material. For example, backplate 542 can be a PCB material, where the motherboard or PCB on which the connector is mounted would be a first PCB and the backplate can be a second PCB. In one example, backplate 542 comprises an acrylic material. In one example, backplate 542 is a polymer composite such as an epoxy material. Whatever type of material backplate 542 is, in one example, the backplate can include at least a portion to adhere to the mounting tabs with solder. In one example, the backplate can be connected to mounting tabs 530 via a mechanism other than solder.

Figure 5B:
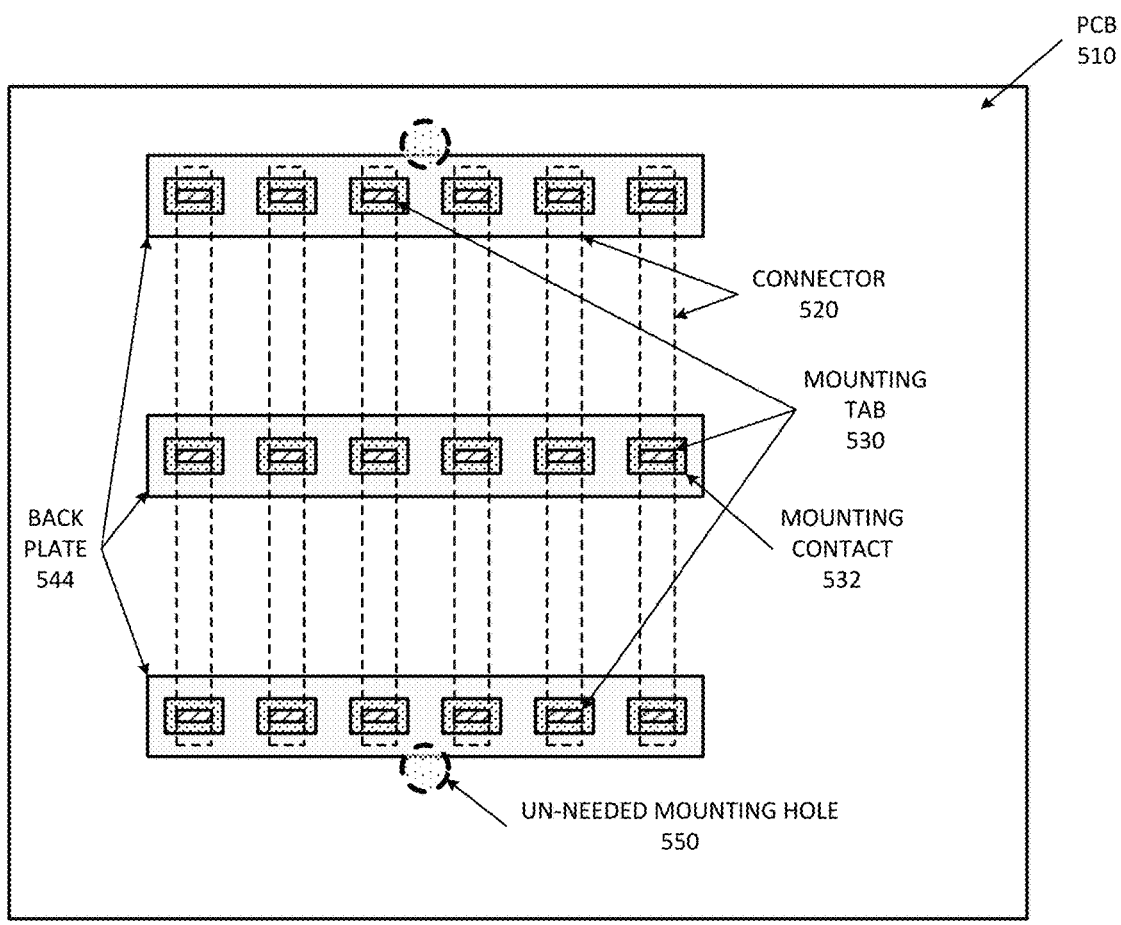

FIG. 5B is a diagrammatic representation of an example of a backplate to couple to mounting tabs through the PCB. Diagram 504 represents an example of a backplate for a connector in accordance with any example herein, such as diagram 106, diagram 230, diagram 330, or system 400.

PCB 510 represents a main PCB or motherboard for a system. Diagram 504 shows the back side of PCB 510 to which backplate 544 will be mounted. Connectors 520 are illustrated as dashed lines to show an example of where they might be located on the other side of PCB 510.

Connectors 520 include mounting tabs 530 to extend through PCB 510 and connect to backplate 544. Backplate 544 is a segmented backplate that connects in strips to mounting tabs 530. Each segment of backplate 544 extends across all connectors 520, but does not extend across all mounting tabs 530 of a connector 520. Thus, a segment connects to a selected mounting tabs of all connectors 520 and multiple segments are used to connect to all mounting tabs. Backplate 544 can reinforce in one horizontal direction (the x direction or the y direction, depending on the orientation selected). The segments of backplate 544 are illustrated as rectangles. The segments of backplate 544 can be rectangular or any other shape, including non-symmetric shapes, to accommodate system requirements.

As with backplate 542, the segments of backplate 544 can include mounting contacts 532 corresponding to mounting tabs 530. Backplate 544 can be connected to mounting tabs 530 in any way as backplate 542. Backplate 544 can include any material as described with respect to backplate 542.

Figure 5C:
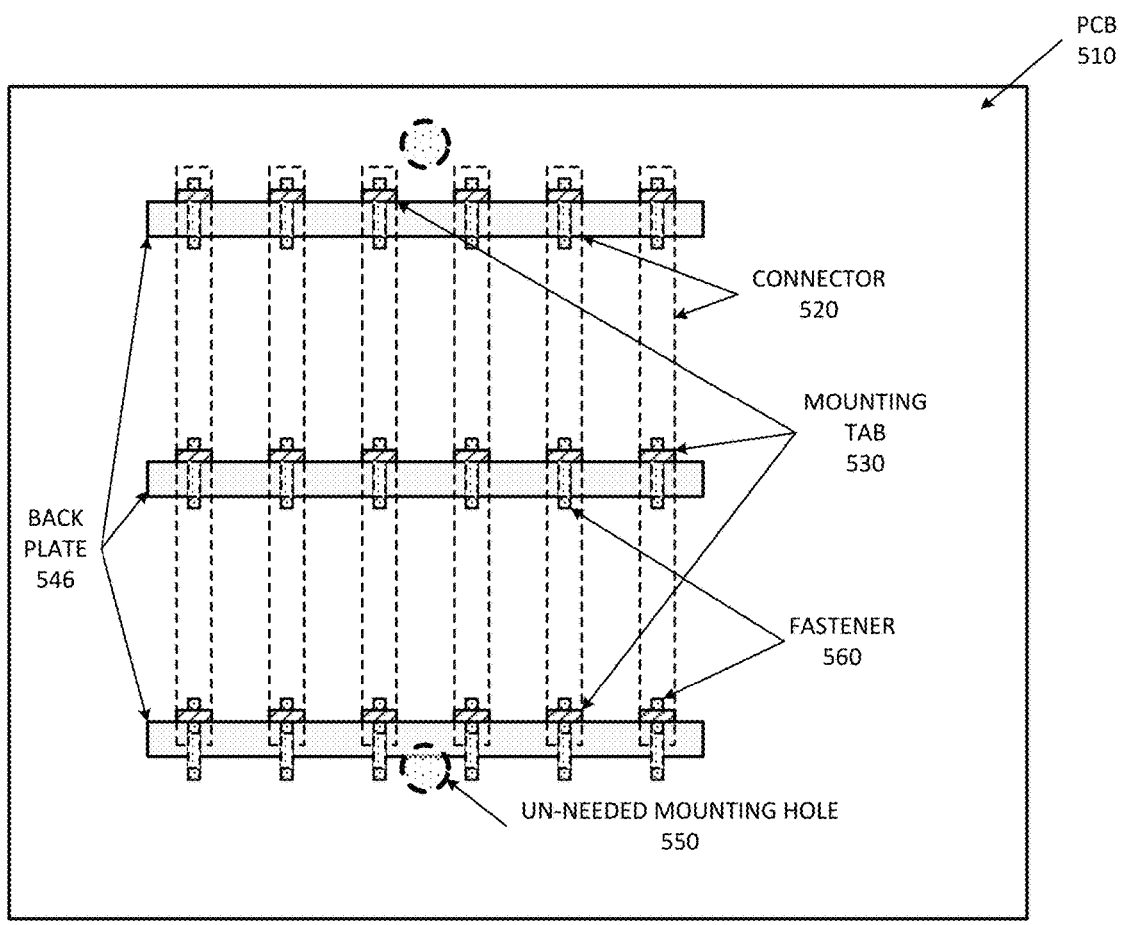

FIG. 5C is a diagrammatic representation of an example of a backplate to couple to mounting tabs through the PCB. Diagram 506 represents an example of a backplate for a connector in accordance with any example herein, such as diagram 106, diagram 230, diagram 330, or system 400.

PCB 510 represents a main PCB or motherboard for a system. Diagram 506 shows the back side of PCB 510 to which backplate 546 will be mounted. Connectors 520 are illustrated as dashed lines to show an example of where they might be located on the other side of PCB 510.

Connectors 520 include mounting tabs 530 to extend through PCB 510 and connect to backplate 546. Backplate 546 is illustrated as a segmented backplate that connects in strips to mounting tabs 530. In one example, backplate 546 is a single large backplate as with backplate 542.

Rather than including mounting contacts for solder connections, backplate 546 includes a mechanism for the use of a screw, rivet, or pin, illustrated as fastener 560. When backplate 546 is segmented, each segment of backplate 546 extends across all connectors 520, but does not extend across all mounting tabs 530 of a connector 520. When backplate 546 is a single large backplate, the backplate extends across all mounting tabs across all connectors and across all the connector. As with backplate 542, backplate 546 can include any material as described with respect to backplate 542.

In one example, fasteners 560 are clips that clip onto mounting tabs 530. In one example, fasteners 560 can extend through holes in mounting tabs 530. The holes can be in accordance with holes 318 of tabs 316 of diagram 310. In one example, backplate 546 includes one or more structures to secure to the holes through the mounting tabs 530.

Figure 6:
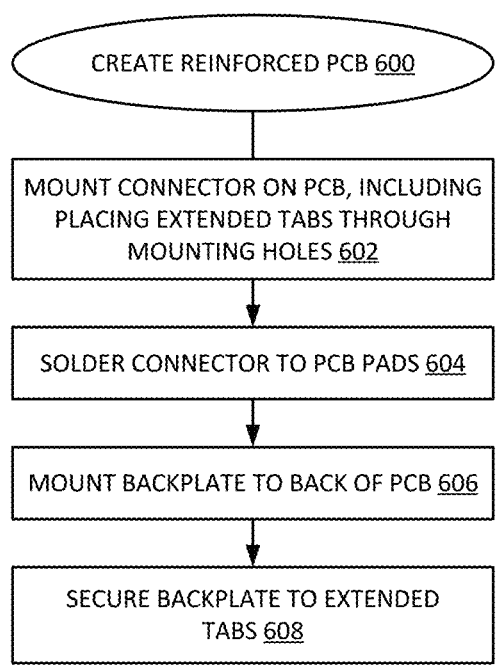
FIG. 6 is a flow diagram of an example of a process for mounting a connector to a PCB with a backplate.

FIG. 6 is a flow diagram of an example of a process for mounting a connector to a PCB with a backplate to create a reinforced PCB. Process 600 represents the process for creating reinforcement for the PCB when the connector is mounted to it.

In one example, the connector is mounted on the PCB, including positioning or placing extended tabs of the connectors through mounting holes in the PCB, at 602. In one example, the connector is soldered to the PCB pads, the electrical contacts of the connector making electrical contact with the PCB pads, at 604.

The backplate is mounted to the back of the PCB, at 606. The mounting of the backplate to the back of the PCB can be in accordance with any example described. The backplate is mounted to extended tabs of the connector that extend through the PCB to the back side. The process includes securing the backplate to the extended tabs in accordance with any example herein, via solder or fasteners, or other mechanism, at 608.

Figure 7:
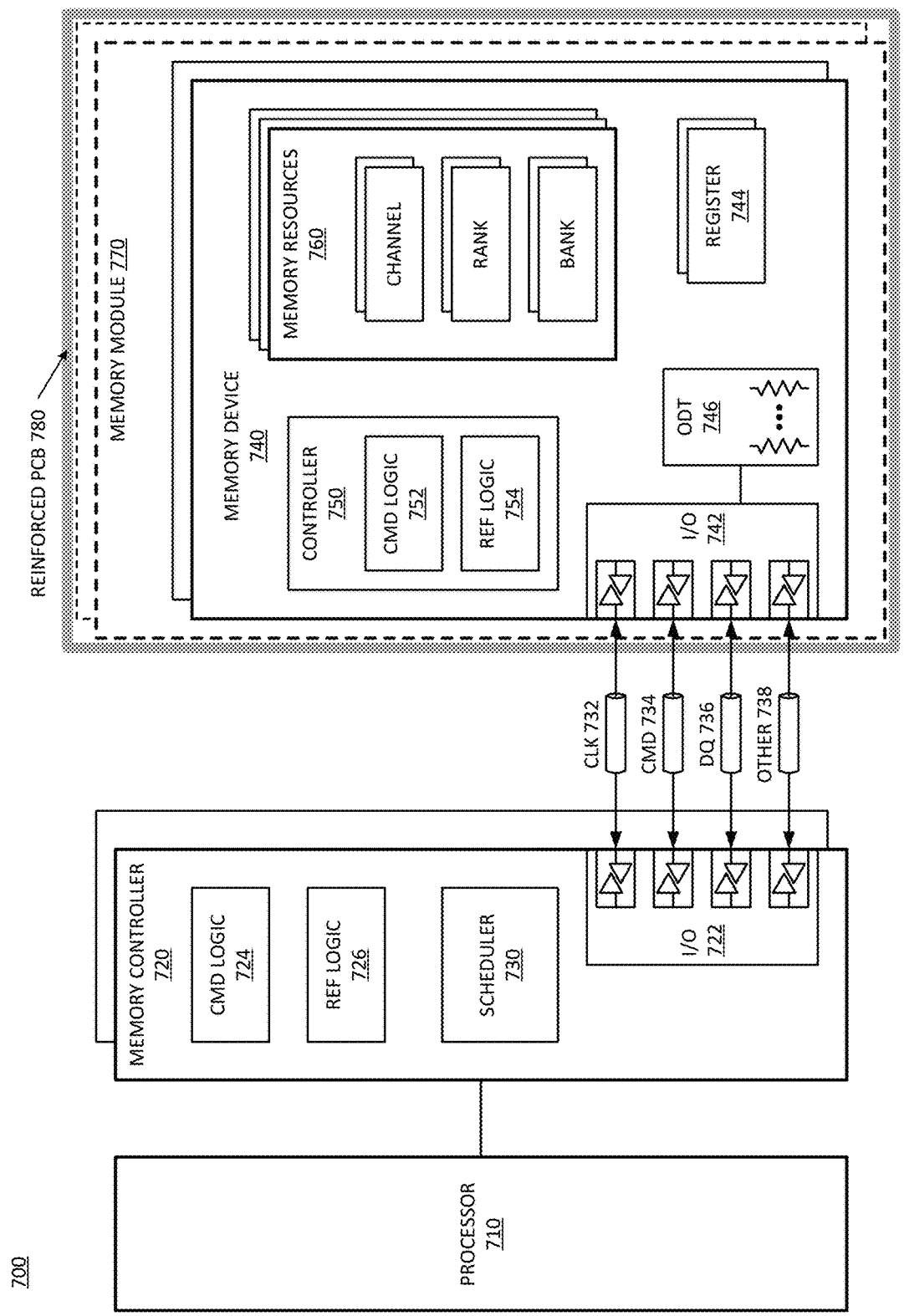
FIG. 7 is a block diagram of an example of a memory subsystem in which a mounting backplate for a memory connector can be implemented.

FIG. 7 is a block diagram of an example of a memory subsystem in which a mounting backplate for a memory connector can be implemented. System 700 includes a processor and elements of a memory subsystem in a computing device.

In one example, system 700 includes reinforced PCB 780 for memory module 770. The reinforced PCB can be in accordance with any example herein. Reinforced PCB 780 includes a PCB with a backplate fastened to mounting tabs of a connector of memory module 770. The mounting tabs can be extended mounting tabs in accordance with any example herein. The backplate can be a backplate in accordance with any example herein.

Processor 710 represents a processing unit of a computing platform that may execute an operating system (OS) and applications, which can collectively be referred to as the host or the user of the memory. The OS and applications execute operations that result in memory accesses. Processor 710 can include one or more separate processors. Each separate processor can include a single processing unit, a multicore processing unit or multicore processor, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processer via a bus (e.g., PCI express), or a combination. System 700 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, JESD79, initial specification published in September 2012 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235A, originally published by JEDEC in November 2015), DDR5 (DDR version 5, currently in discussion by JEDEC), LPDDR5 (low power DDR version 5, JESD209-5, originally published by JEDEC in February 2019), HBM2 ((HBM version 2), currently in discussion by JEDEC), or others or combinations of memory technologies, and technologies based on derivatives or extensions of such specifications.

In addition to, or alternatively to, volatile memory, in one example, reference to memory devices can refer to a nonvolatile memory device whose state is determinate even if power is interrupted to the device. In one example, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one example, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one example, a system with volatile memory that needs to be refreshed can also include nonvolatile memory.

Memory controller 720 represents one or more memory controller circuits or devices for system 700. Memory controller 720 represents control logic that generates memory access commands in response to the execution of operations by processor 710. Memory controller 720 accesses one or more memory devices 740. Memory devices 740 can be DRAM devices in accordance with any referred to above. In one example, memory devices 740 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one example, settings for each channel are controlled by separate mode registers or other register settings. In one example, each memory controller 720 manages a separate memory channel, although system 700 can be configured to have multiple channels managed by a single controller, or to have multiple controllers on a single channel. In one example, memory controller 720 is part of host processor 710, such as logic implemented on the same die or implemented in the same package space as the processor.

Memory controller 720 includes I/O interface logic 722 to couple to a memory bus, such as a memory channel as referred to above. I/O interface logic 722 (as well as I/O interface logic 742 of memory device 740) can include pins, pads, connectors, signal lines, traces, or wires, or other hardware to connect the devices, or a combination of these. I/O interface logic 722 can include a hardware interface. As illustrated, I/O interface logic 722 includes at least drivers/transceivers for signal lines. Commonly, wires within an integrated circuit interface couple with a pad, pin, or connector to interface signal lines or traces or other wires between devices. I/O interface logic 722 can include drivers, receivers, transceivers, or termination, or other circuitry or combinations of circuitry to exchange signals on the signal lines between the devices. The exchange of signals includes at least one of transmit or receive. While shown as coupling I/O 722 from memory controller 720 to I/O 742 of memory device 740, it will be understood that in an implementation of system 700 where groups of memory devices 740 are accessed in parallel, multiple memory devices can include I/O interfaces to the same interface of memory controller 720. In an implementation of system 700 including one or more memory modules 770, I/O 742 can include interface hardware of the memory module in addition to interface hardware on the memory device itself. Other memory controllers 720 will include separate interfaces to other memory devices 740.

The bus between memory controller 720 and memory devices 740 can be implemented as multiple signal lines coupling memory controller 720 to memory devices 740. The bus may typically include at least clock (CLK) 732, command/address (CMD) 734, and write data (DQ) and read data (DQ) 736, and zero or more other signal lines 738. In one example, a bus or connection between memory controller 720 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one example, independent channels have different clock signals, C/A buses, data buses, and other signal lines. Thus, system 700 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 720 and memory devices 740. An example of a serial bus technology is 8B10B encoding and transmission of high-speed data with embedded clock over a single differential pair of signals in each direction. In one example, CMD 734 represents signal lines shared in parallel with multiple memory devices. In one example, multiple memory devices share encoding command signal lines of CMD 734, and each has a separate chip select (CS_n) signal line to select individual memory devices.

It will be understood that in the example of system 700, the bus between memory controller 720 and memory devices 740 includes a subsidiary command bus CMD 734 and a subsidiary bus to carry the write and read data, DQ 736. In one example, the data bus can include bidirectional lines for read data and for write/command data. In another example, the subsidiary bus DQ 736 can include unidirectional write signal lines for write and data from the host to memory, and can include unidirectional lines for read data from the memory to the host. In accordance with the chosen memory technology and system design, other signals 738 may accompany a bus or sub bus, such as strobe lines DQS. Based on design of system 700, or implementation if a design supports multiple implementations, the data bus can have more or less bandwidth per memory device 740. For example, the data bus can support memory devices that have either a x32 interface, a x16 interface, a x8 interface, or other interface. The convention "xW," where W is an integer that refers to an interface size or width of the interface of memory device 740, which represents a number of signal lines to exchange data with memory controller 720. The interface size of the memory devices is a controlling factor on how many memory devices can be used concurrently per channel in system 700 or coupled in parallel to the same signal lines. In one example, high bandwidth memory devices, wide interface devices, or stacked memory configurations, or combinations, can enable wider interfaces, such as a x128 interface, a x256 interface, a x512 interface, a x1024 interface, or other data bus interface width.

In one example, memory devices 740 and memory controller 720 exchange data over the data bus in a burst, or a sequence of consecutive data transfers. The burst corresponds to a number of transfer cycles, which is related to a bus frequency. In one example, the transfer cycle can be a whole clock cycle for transfers occurring on a same clock or strobe signal edge (e.g., on the rising edge). In one example, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 740 can transfer data on each UI. Thus, a x8 memory device operating on BL8 can transfer 74 bits of data (8 data signal lines times 8 data bits transferred per line over the burst). It will be understood that this simple example is merely an illustration and is not limiting.

Memory devices 740 represent memory resources for system 700. In one example, each memory device 740 is a separate memory die. In one example, each memory device 740 can interface with multiple (e.g., 2) channels per device or die. Each memory device 740 includes I/O interface logic 742, which has a bandwidth determined by the implementation of the device (e.g., x16 or x8 or some other interface bandwidth). I/O interface logic 742 enables the memory devices to interface with memory controller 720. I/O interface logic 742 can include a hardware interface, and can be in accordance with I/O 722 of memory controller, but at the memory device end. In one example, multiple memory devices 740 are connected in parallel to the same command and data buses. In another example, multiple memory devices 740 are connected in parallel to the same command bus, and are connected to different data buses. For example, system 700 can be configured with multiple memory devices 740 coupled in parallel, with each memory device responding to a command, and accessing memory resources 760 internal to each. For a Write operation, an individual memory device 740 can write a portion of the overall data word, and for a Read operation, an individual memory device 740 can fetch a portion of the overall data word. As non-limiting examples, a specific memory device can provide or receive, respectively, 8 bits of a 128-bit data word for a Read or Write transaction, or 8 bits or 16 bits (depending for a x8 or a x16 device) of a 256-bit data word. The remaining bits of the word will be provided or received by other memory devices in parallel.

In one example, memory devices 740 are disposed directly on a motherboard or host system platform (e.g., a PCB (printed circuit board) on which processor 710 is disposed) of a computing device. In one example, memory devices 740 can be organized into memory modules 770. In one example, memory modules 770 represent dual inline memory modules (DIMMs). In one example, memory modules 770 represent other organization of multiple memory devices to share at least a portion of access or control circuitry, which can be a separate circuit, a separate device, or a separate board from the host system platform. Memory modules 770 can include multiple memory devices 740, and the memory modules can include support for multiple separate channels to the included memory devices disposed on them. In another example, memory devices 740 may be incorporated into the same package as memory controller 720, such as by techniques such as multi-chip-module (MCM), package-on-package, through-silicon via (TSV), or other techniques or combinations. Similarly, in one example, multiple memory devices 740 may be incorporated into memory modules 770, which themselves may be incorporated into the same package as memory controller 720. It will be appreciated that for these and other implementations, memory controller 720 may be part of host processor 710.

Memory devices 740 each include memory resources 760. Memory resources 760 represent individual arrays of memory locations or storage locations for data. Typically memory resources 760 are managed as rows of data, accessed via wordline (rows) and bitline (individual bits within a row) control. Memory resources 760 can be organized as separate channels, ranks, and banks of memory. Channels may refer to independent control paths to storage locations within memory devices 740. Ranks may refer to common locations across multiple memory devices (e.g., same row addresses within different devices). Banks may refer to arrays of memory locations within a memory device 740. In one example, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one example, memory devices 740 include one or more registers 744. Register 744 represents one or more storage devices or storage locations that provide configuration or settings for the operation of the memory device. In one example, register 744 can provide a storage location for memory device 740 to store data for access by memory controller 720 as part of a control or management operation. In one example, register 744 includes one or more Mode Registers. In one example, register 744 includes one or more multipurpose registers. The configuration of locations within register 744 can configure memory device 740 to operate in different "modes," where command information can trigger different operations within memory device 740 based on the mode. Additionally or in the alternative, different modes can also trigger different operation from address information or other signal lines depending on the mode. Settings of register 744 can indicate configuration for I/O settings (e.g., timing, termination or ODT (on-die termination) 746, driver configuration, or other I/O settings).

In one example, memory device 740 includes ODT 746 as part of the interface hardware associated with I/O 742. ODT 746 can be configured as mentioned above, and provide settings for impedance to be applied to the interface to specified signal lines. In one example, ODT 746 is applied to DQ signal lines. In one example, ODT 746 is applied to command signal lines. In one example, ODT 746 is applied to address signal lines. In one example, ODT 746 can be applied to any combination of the preceding. The ODT settings can be changed based on whether a memory device is a selected target of an access operation or a non-target device. ODT 746 settings can affect the timing and reflections of signaling on the terminated lines. Careful control over ODT 746 can enable higher-speed operation with improved matching of applied impedance and loading. ODT 746 can be applied to specific signal lines of I/O interface 742, 722, and is not necessarily applied to all signal lines.

Memory device 740 includes controller 750, which represents control logic within the memory device to control internal operations within the memory device. For example, controller 750 decodes commands sent by memory controller 720 and generates internal operations to execute or satisfy the commands. Controller 750 can be referred to as an internal controller, and is separate from memory controller 720 of the host. Controller 750 can determine what mode is selected based on register 744, and configure the internal execution of operations for access to memory resources 760 or other operations based on the selected mode. Controller 750 generates control signals to control the routing of bits within memory device 740 to provide a proper interface for the selected mode and direct a command to the proper memory locations or addresses. Controller 750 includes command logic 752, which can decode command encoding received on command and address signal lines. Thus, command logic 752 can be or include a command decoder. With command logic 752, memory device can identify commands and generate internal operations to execute requested commands.

Referring again to memory controller 720, memory controller 720 includes command (CMD) logic 724, which represents logic or circuitry to generate commands to send to memory devices 740. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 740, memory controller 720 can issue commands via I/O 722 to cause memory device 740 to execute the commands. In one example, controller 750 of memory device 740 receives and decodes command and address information received via I/O 742 from memory controller 720. Based on the received command and address information, controller 750 can control the timing of operations of the logic and circuitry within memory device 740 to execute the commands. Controller 750 is responsible for compliance with standards or specifications within memory device 740, such as timing and signaling requirements. Memory controller 720 can implement compliance with standards or specifications by access scheduling and control.

Memory controller 720 includes scheduler 730, which represents logic or circuitry to generate and order transactions to send to memory device 740. From one perspective, the primary function of memory controller 720 could be said to schedule memory access and other transactions to memory device 740. Such scheduling can include generating the transactions themselves to implement the requests for data by processor 710 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 720 typically includes logic such as scheduler 730 to allow selection and ordering of transactions to improve performance of system 700. Thus, memory controller 720 can select which of the outstanding transactions should be sent to memory device 740 in which order, which is typically achieved with logic much more complex that a simple first-in first-out algorithm. Memory controller 720 manages the transmission of the transactions to memory device 740, and manages the timing associated with the transaction. In one example, transactions have deterministic timing, which can be managed by memory controller 720 and used in determining how to schedule the transactions with scheduler 730.

In one example, memory controller 720 includes refresh (REF) logic 726. Refresh logic 726 can be used for memory resources that are volatile and need to be refreshed to retain a deterministic state. In one example, refresh logic 726 indicates a location for refresh, and a type of refresh to perform. Refresh logic 726 can trigger self-refresh within memory device 740, or execute external refreshes which can be referred to as auto refresh commands) by sending refresh commands, or a combination. In one example, system 700 supports all bank refreshes as well as per bank refreshes. All bank refreshes cause the refreshing of banks within all memory devices 740 coupled in parallel. Per bank refreshes cause the refreshing of a specified bank within a specified memory device 740. In one example, controller 750 within memory device 740 includes refresh logic 754 to apply refresh within memory device 740. In one example, refresh logic 754 generates internal operations to perform refresh in accordance with an external refresh received from memory controller 720. Refresh logic 754 can determine if a refresh is directed to memory device 740, and what memory resources 760 to refresh in response to the command.

Figure 8:
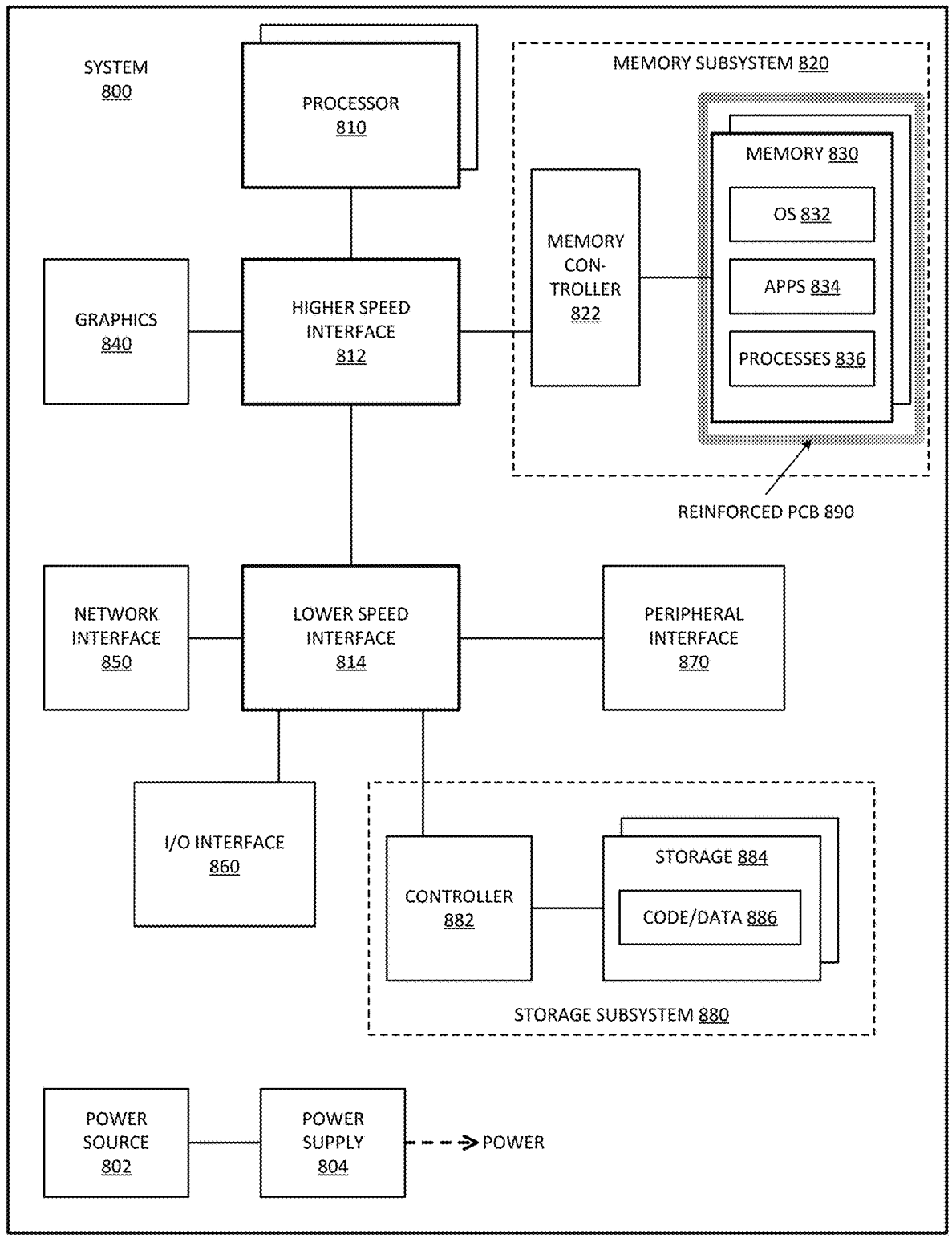
FIG. 8 is a block diagram of an example of a computing system in which a mounting backplate for a memory connector can be implemented.

FIG. 8 is a block diagram of an example of a computing system in which a mounting backplate for a memory connector can be implemented. System 800 represents a computing device in accordance with any example herein, and can be a laptop computer, a desktop computer, a tablet computer, a server, a gaming or entertainment control system, embedded computing device, or other electronic device.

In one example, system 800 includes memory 830 with reinforced PCB 890 for mounting on a system motherboard. The reinforced PCB can be in accordance with any example herein. Reinforced PCB 890 includes a PCB with a backplate fastened to mounting tabs of a connector of memory 830. The mounting tabs can be extended mounting tabs in accordance with any example herein. The backplate can be a backplate in accordance with any example herein.

System 800 includes processor 810 can include any type of microprocessor, central processing unit (CPU), graphics processing unit (GPU), processing core, or other processing hardware, or a combination, to provide processing or execution of instructions for system 800. Processor 810 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or a combination of such devices.

In one example, system 800 includes interface 812 coupled to processor 810, which can represent a higher speed interface or a high throughput interface for system components that need higher bandwidth connections, such as memory subsystem 820 or graphics interface components 840. Interface 812 represents an interface circuit, which can be a standalone component or integrated onto a processor die. Interface 812 can be integrated as a circuit onto the processor die or integrated as a component on a system on a chip. Where present, graphics interface 840 interfaces to graphics components for providing a visual display to a user of system 800. Graphics interface 840 can be a standalone component or integrated onto the processor die or system on a chip. In one example, graphics interface 840 can drive a high definition (HD) display that provides an output to a user. In one example, the display can include a touchscreen display. In one example, graphics interface 840 generates a display based on data stored in memory 830 or based on operations executed by processor 810 or both.

Memory subsystem 820 represents the main memory of system 800, and provides storage for code to be executed by processor 810, or data values to be used in executing a routine. Memory subsystem 820 can include one or more memory devices 830 such as read-only memory (ROM), flash memory, one or more varieties of random access memory (RAM) such as DRAM, or other memory devices, or a combination of such devices. Memory 830 stores and hosts, among other things, operating system (OS) 832 to provide a software platform for execution of instructions in system 800. Additionally, applications 834 can execute on the software platform of OS 832 from memory 830. Applications 834 represent programs that have their own operational logic to perform execution of one or more functions. Processes 836 represent agents or routines that provide auxiliary functions to OS 832 or one or more applications 834 or a combination. OS 832, applications 834, and processes 836 provide software logic to provide functions for system 800. In one example, memory subsystem 820 includes memory controller 822, which is a memory controller to generate and issue commands to memory 830. It will be understood that memory controller 822 could be a physical part of processor 810 or a physical part of interface 812. For example, memory controller 822 can be an integrated memory controller, integrated onto a circuit with processor 810, such as integrated onto the processor die or a system on a chip.

While not specifically illustrated, it will be understood that system 800 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or other bus, or a combination.

In one example, system 800 includes interface 814, which can be coupled to interface 812. Interface 814 can be a lower speed interface than interface 812. In one example, interface 814 represents an interface circuit, which can include standalone components and integrated circuitry. In one example, multiple user interface components or peripheral components, or both, couple to interface 814. Network interface 850 provides system 800 the ability to communicate with remote devices (e.g., servers or other computing devices) over one or more networks. Network interface 850 can include an Ethernet adapter, wireless interconnection components, cellular network interconnection components, USB (universal serial bus), or other wired or wireless standards-based or proprietary interfaces. Network interface 850 can exchange data with a remote device, which can include sending data stored in memory or receiving data to be stored in memory.

In one example, system 800 includes one or more input/output (I/O) interface(s) 860. I/O interface 860 can include one or more interface components through which a user interacts with system 800 (e.g., audio, alphanumeric, tactile/touch, or other interfacing). Peripheral interface 870 can include any hardware interface not specifically mentioned above. Peripherals refer generally to devices that connect dependently to system 800. A dependent connection is one where system 800 provides the software platform or hardware platform or both on which operation executes, and with which a user interacts.

In one example, system 800 includes storage subsystem 880 to store data in a nonvolatile manner. In one example, in certain system implementations, at least certain components of storage 880 can overlap with components of memory subsystem 820. Storage subsystem 880 includes storage device(s) 884, which can be or include any conventional medium for storing large amounts of data in a nonvolatile manner, such as one or more magnetic, solid state, or optical based disks, or a combination. Storage 884 holds code or instructions and data 886 in a persistent state (i.e., the value is retained despite interruption of power to system 800). Storage 884 can be generically considered to be a "memory," although memory 830 is typically the executing or operating memory to provide instructions to processor 810. Whereas storage 884 is nonvolatile, memory 830 can include volatile memory (i.e., the value or state of the data is indeterminate if power is interrupted to system 800). In one example, storage subsystem 880 includes controller 882 to interface with storage 884. In one example controller 882 is a physical part of interface 814 or processor 810, or can include circuits or logic in both processor 810 and interface 814.

Power source 802 provides power to the components of system 800. More specifically, power source 802 typically interfaces to one or multiple power supplies 804 in system 800 to provide power to the components of system 800. In one example, power supply 804 includes an AC to DC (alternating current to direct current) adapter to plug into a wall outlet. Such AC power can be renewable energy (e.g., solar power) power source 802. In one example, power source 802 includes a DC power source, such as an external AC to DC converter. In one example, power source 802 or power supply 804 includes wireless charging hardware to charge via proximity to a charging field. In one example, power source 802 can include an internal battery or fuel cell source.

Figure 9:
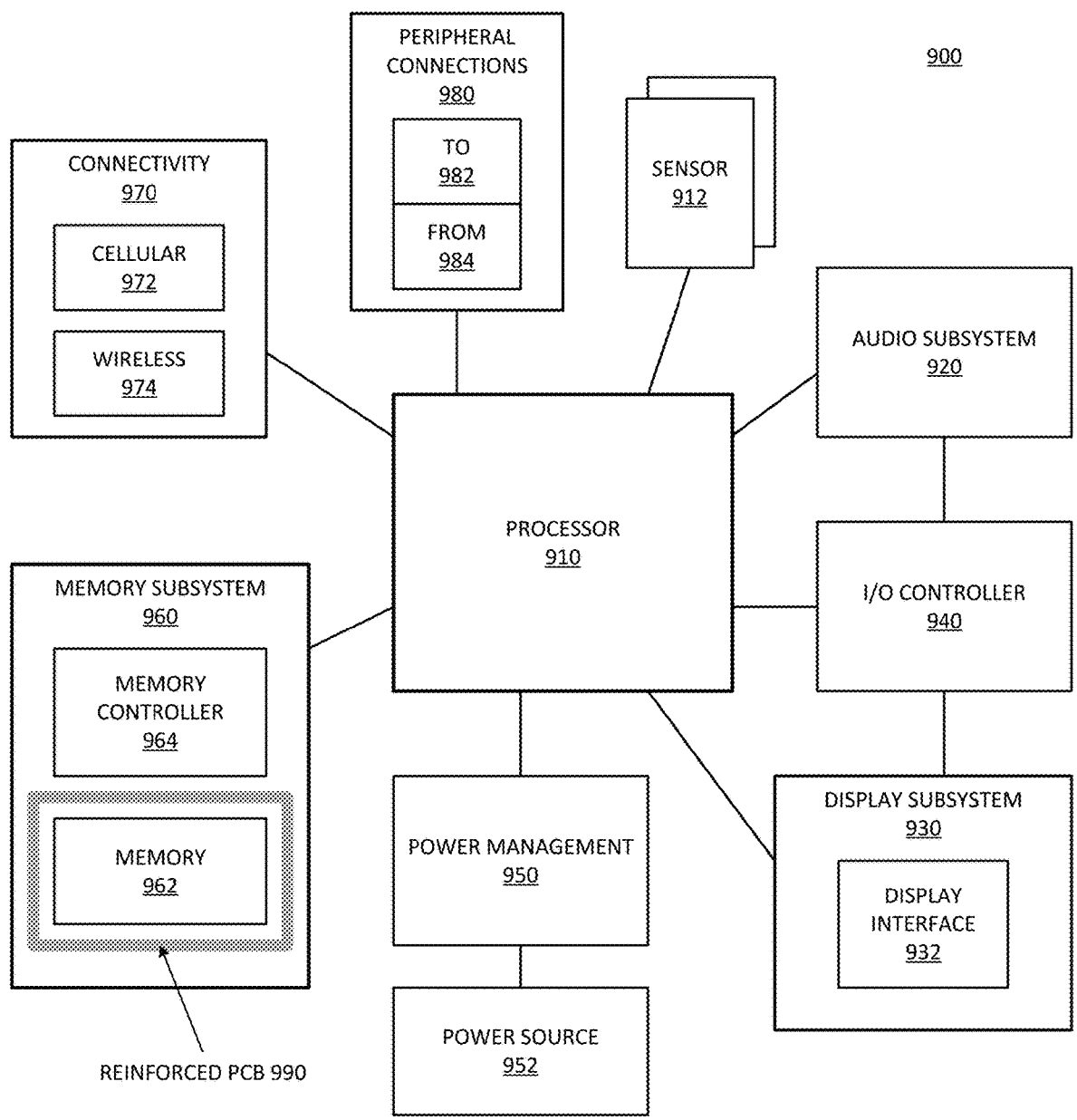
FIG. 9 is a block diagram of an example of a mobile device in which a mounting backplate for a memory connector can be implemented.

FIG. 9 is a block diagram of an example of a mobile device in which a mounting backplate for a memory connector can be implemented. System 900 represents a mobile computing device, such as a computing tablet, a mobile phone or smartphone, wearable computing device, or other mobile device, or an embedded computing device. It will be understood that certain of the components are shown generally, and not all components of such a device are shown in system 900.

In one example, system 900 includes memory 962 with reinforced PCB 990 for mounting on a system motherboard. The reinforced PCB can be in accordance with any example herein. Reinforced PCB 990 includes a PCB with a backplate fastened to mounting tabs of a connector of memory 962. The mounting tabs can be extended mounting tabs in accordance with any example herein. The backplate can be a backplate in accordance with any example herein.

System 900 includes processor 910, which performs the primary processing operations of system 900. Processor 910 can include one or more physical devices, such as microprocessors, application processors, microcontrollers, programmable logic devices, or other processing means. The processing operations performed by processor 910 include the execution of an operating platform or operating system on which applications and device functions are executed. The processing operations include operations related to I/O (input/output) with a human user or with other devices, operations related to power management, operations related to connecting system 900 to another device, or a combination. The processing operations can also include operations related to audio I/O, display I/O, or other interfacing, or a combination. Processor 910 can execute data stored in memory. Processor 910 can write or edit data stored in memory.

In one example, system 900 includes one or more sensors 912. Sensors 912 represent embedded sensors or interfaces to external sensors, or a combination. Sensors 912 enable system 900 to monitor or detect one or more conditions of an environment or a device in which system 900 is implemented. Sensors 912 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 912 can also include sensors for biometric systems such as fingerprint recognition systems, face detection or recognition systems, or other systems that detect or recognize user features. Sensors 912 should be understood broadly, and not limiting on the many different types of sensors that could be implemented with system 900. In one example, one or more sensors 912 couples to processor 910 via a frontend circuit integrated with processor 910. In one example, one or more sensors 912 couples to processor 910 via another component of system 900.

In one example, system 900 includes audio subsystem 920, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into system 900, or connected to system 900. In one example, a user interacts with system 900 by providing audio commands that are received and processed by processor 910.

Display subsystem 930 represents hardware (e.g., display devices) and software components (e.g., drivers) that provide a visual display for presentation to a user. In one example, the display includes tactile components or touchscreen elements for a user to interact with the computing device. Display subsystem 930 includes display interface 932, which includes the particular screen or hardware device used to provide a display to a user. In one example, display interface 932 includes logic separate from processor 910 (such as a graphics processor) to perform at least some processing related to the display. In one example, display subsystem 930 includes a touchscreen device that provides both output and input to a user. In one example, display subsystem 930 includes a high definition (HD) or ultra-high definition (UHD) display that provides an output to a user. In one example, display subsystem includes or drives a touchscreen display. In one example, display subsystem 930 generates display information based on data stored in memory or based on operations executed by processor 910 or both.

I/O controller 940 represents hardware devices and software components related to interaction with a user. I/O controller 940 can operate to manage hardware that is part of audio subsystem 920, or display subsystem 930, or both. Additionally, I/O controller 940 illustrates a connection point for additional devices that connect to system 900 through which a user might interact with the system. For example, devices that can be attached to system 900 might include microphone devices, speaker or stereo systems, video systems or other display device, keyboard or keypad devices, or other I/O devices for use with specific applications such as card readers or other devices.

As mentioned above, I/O controller 940 can interact with audio subsystem 920 or display subsystem 930 or both. For example, input through a microphone or other audio device can provide input or commands for one or more applications or functions of system 900. Additionally, audio output can be provided instead of or in addition to display output. In another example, if display subsystem includes a touchscreen, the display device also acts as an input device, which can be at least partially managed by I/O controller 940. There can also be additional buttons or switches on system 900 to provide I/O functions managed by I/O controller 940.

In one example, I/O controller 940 manages devices such as accelerometers, cameras, light sensors or other environmental sensors, gyroscopes, global positioning system (GPS), or other hardware that can be included in system 900, or sensors 912. The input can be part of direct user interaction, as well as providing environmental input to the system to influence its operations (such as filtering for noise, adjusting displays for brightness detection, applying a flash for a camera, or other features).

In one example, system 900 includes power management 950 that manages battery power usage, charging of the battery, and features related to power saving operation. Power management 950 manages power from power source 952, which provides power to the components of system 900. In one example, power source 952 includes an AC to DC (alternating current to direct current) adapter to plug into a wall outlet. Such AC power can be renewable energy (e.g., solar power, motion based power). In one example, power source 952 includes only DC power, which can be provided by a DC power source, such as an external AC to DC converter. In one example, power source 952 includes wireless charging hardware to charge via proximity to a charging field. In one example, power source 952 can include an internal battery or fuel cell source.

Memory subsystem 960 includes memory device(s) 962 for storing information in system 900. Memory subsystem 960 can include nonvolatile (state does not change if power to the memory device is interrupted) or volatile (state is indeterminate if power to the memory device is interrupted) memory devices, or a combination. Memory 960 can store application data, user data, music, photos, documents, or other data, as well as system data (whether long-term or temporary) related to the execution of the applications and functions of system 900. In one example, memory subsystem 960 includes memory controller 964 (which could also be considered part of the control of system 900, and could potentially be considered part of processor 910). Memory controller 964 includes a scheduler to generate and issue commands to control access to memory device 962.

Connectivity 970 includes hardware devices (e.g., wireless or wired connectors and communication hardware, or a combination of wired and wireless hardware) and software components (e.g., drivers, protocol stacks) to enable system 900 to communicate with external devices. The external device could be separate devices, such as other computing devices, wireless access points or base stations, as well as peripherals such as headsets, printers, or other devices. In one example, system 900 exchanges data with an external device for storage in memory or for display on a display device. The exchanged data can include data to be stored in memory, or data already stored in memory, to read, write, or edit data.

Connectivity 970 can include multiple different types of connectivity. To generalize, system 900 is illustrated with cellular connectivity 972 and wireless connectivity 974. Cellular connectivity 972 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 974 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 980 include hardware interfaces and connectors, as well as software components (e.g., drivers, protocol stacks) to make peripheral connections. It will be understood that system 900 could both be a peripheral device ("to" 982) to other computing devices, as well as have peripheral devices ("from" 984) connected to it. System 900 commonly has a "docking" connector to connect to other computing devices for purposes such as managing (e.g., downloading, uploading, changing, synchronizing) content on system 900. Additionally, a docking connector can allow system 900 to connect to certain peripherals that allow system 900 to control content output, for example, to audiovisual or other systems.

In addition to a proprietary docking connector or other proprietary connection hardware, system 900 can make peripheral connections 980 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), or other type.

In general with respect to the descriptions herein, in one example, an apparatus includes: a connector including multiple contacts; a printed circuit board (PCB) including pads to connect with the connector and structural mounting holes through the PCB, wherein the connector includes mounting tabs separate from the multiple contacts, the mounting tabs to extend through the structural mounting holes; and a back plate to connect with the mounting tabs.

In one example, the connector comprises a connector for a dual inline memory module (DIMM). In one example, the pads comprise surface mount pads. In one example, the pads comprise through-hole pads, and wherein the back plate further comprises an electrical insulator. In one example, the back plate comprises a metallic plate. In one example, the metallic plate comprises at least a portion to adhere to the mounting tabs with solder. In one example, the back plate comprises a non-metallic material. In one example, the PCB comprises a first PCB, and wherein the back plate comprises a second PCB with mounting holes to solder to the mounting tabs. In one example, the mounting tabs include holes through the mounting tabs, and wherein the back plate comprises a structure to secure to the holes through the mounting tabs.

In general with respect to the descriptions herein, in one example, a computing device includes: a printed circuit board (PCB) motherboard; a processor mounted on the PCB motherboard; a connector including multiple contacts mounted on pads on the PCB motherboard and mounting tabs to extend through structural mounting holes through the PCB motherboard; and a back plate to connect with the mounting tabs.

In one example, the connector comprises a connector for a dual inline memory module (DIMM). In one example, the pads comprise surface mount pads. In one example, the pads comprise through-hole pads, and wherein the back plate further comprises an electrical insulator. In one example, the back plate comprises a metallic plate. In one example, the metallic plate comprises at least a portion to adhere to the mounting tabs with solder. In one example, the back plate comprises a non-metallic material. In one example, the PCB comprises a first PCB, and wherein the back plate comprises a second PCB with mounting holes to solder to the mounting tabs. In one example, the mounting tabs include holes through the mounting tabs, and wherein the back plate comprises a structure to secure to the holes through the mounting tabs. In one example, the processor includes a multicore processor. In one example, the computing device includes a display communicatively coupled to the processor. In one example, the computing device includes a network interface communicatively coupled to the processor. In one example, the computing device includes a battery to power the computing device.

Flow diagrams as illustrated herein provide examples of sequences of various process actions. The flow diagrams can indicate operations to be executed by a software or firmware routine, as well as physical operations. A flow diagram can illustrate an example of the implementation of states of a finite state machine (FSM), which can be implemented in hardware and/or software. Although shown in a particular sequence or order, unless otherwise specified, the order of the actions can be modified. Thus, the illustrated diagrams should be understood only as examples, and the process can be performed in a different order, and some actions can be performed in parallel. Additionally, one or more actions can be omitted; thus, not all implementations will perform all actions.

To the extent various operations or functions are described herein, they can be described or defined as software code, instructions, configuration, and/or data. The content can be directly executable ("object" or "executable" form), source code, or difference code ("delta" or "patch" code). The software content of what is described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to what is disclosed and implementations of the invention without departing from their scope. Therefore, the illustrations and examples herein should be construed in an illustrative, and not a restrictive sense. The scope of the invention should be measured solely by reference to the claims that follow.

What is claimed is:

1. An apparatus, comprising:
a dual inline memory module (DIMM) connector including multiple contacts and including mounting tabs extending from the DIMM connector, the mounting tabs having a rectangular cross-section;
a printed circuit board (PCB) including pads to connect with the DIMM connector and structural mounting holes through the PCB, the mounting tabs to extend through the structural mounting holes; and
a back plate to connect with the mounting tabs.

2. The apparatus of claim 1, wherein the pads comprise surface mount pads.

3. The apparatus of claim 1, wherein the pads comprise through-hole pads, and wherein the back plate further comprises an electrical insulator.

4. The apparatus of claim 1, wherein the back plate comprises a metallic plate.

5. The apparatus of claim 4, wherein the metallic plate comprises at least a portion to adhere to the mounting tabs with solder.

6. The apparatus of claim 1, wherein the back plate comprises a non-metallic material.

7. The apparatus of claim 1, wherein the PCB comprises a first PCB, and wherein the back plate comprises a second PCB with mounting holes to solder to the mounting tabs.

8. The apparatus of claim 1, wherein the mounting tabs include holes through the mounting tabs, and wherein the back plate comprises a structure to secure to the holes through the mounting tabs.

9. A computing device, comprising:
a printed circuit board (PCB) motherboard;
a processor mounted on the PCB motherboard;
a dual inline memory module (DIMM) connector including multiple contacts mounted on pads on the PCB motherboard and mounting tabs to extend through structural mounting holes through the PCB motherboard, the mounting tabs having a rectangular cross-section; and
a back plate to connect with the mounting tabs.

10. The computing device of claim 9, wherein the pads comprise surface mount pads.

11. The computing device of claim 9, wherein the pads comprise through-hole pads, and wherein the back plate further comprises an electrical insulator.

12. The computing device of claim 9, wherein the back plate comprises a metallic plate.

13. The computing device of claim 12, wherein the metallic plate comprises at least a portion to adhere to the mounting tabs with solder.

14. The computing device of claim 9, wherein the back plate comprises a non-metallic material.

15. The computing device of claim 9, wherein the PCB comprises a first PCB, and wherein the back plate comprises a second PCB with mounting holes to solder to the mounting tabs.

16. The computing device of claim 9, wherein the mounting tabs include holes through the mounting tabs, and wherein the back plate comprises a structure to secure to the holes through the mounting tabs.

17. The computing device of claim 9,
wherein the processor includes a multicore processor;
further comprising a display communicatively coupled to the processor;
further comprising a network interface communicatively coupled to the processor; or
further comprising a battery to power the computing device.

* * * * *